US007005217B2

(12) United States Patent
Bailey et al.

(10) Patent No.: US 7,005,217 B2
(45) Date of Patent: Feb. 28, 2006

(54) CHROMELESS PHASE SHIFT MASK

(75) Inventors: George E. Bailey, Welches, OR (US); Neal P. Callan, Lake Oswego, OR (US); John V. Jensen, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 309 days.

(21) Appl. No.: 10/406,847

(22) Filed: Apr. 4, 2003

(65) Prior Publication Data

US 2004/0197674 A1 Oct. 7, 2004

(51) Int. Cl.
*G03F 9/00* (2006.01)

(52) U.S. Cl. ............................................ 430/5; 430/30

(58) Field of Classification Search .................... 430/5, 430/30

See application file for complete search history.

(56) References Cited

U.S. PATENT DOCUMENTS

| | | | | |
|---|---|---|---|---|
| 5,618,643 A * | 4/1997 | Dao et al. | ....................... | 430/5 |
| 5,821,014 A | 10/1998 | Chen et al. | ..................... | 430/5 |
| 6,800,402 B1 * | 10/2004 | Fujimoto | ........................ | 430/5 |
| 2002/0048708 A1 | 4/2002 | Chen et al. | ..................... | 430/5 |

OTHER PUBLICATIONS

Socha et al., Resolution Enhancement with High Transmission Attenuating Phase Shift Masks, Society of Photo-Optical Instrumentation Engineers, Photomask and X-Ray Technology VI, vol. 3748, 1999.

* cited by examiner

*Primary Examiner*—Christopher G. Young
(74) *Attorney, Agent, or Firm*—Luedeka, Neely & Graham, P.C.

(57) ABSTRACT

A photolithographic mask for receiving light at a wavelength, phase, and intensity and printing a desired image on a substrate with an optical system. The mask is formed on an optically transmissive substrate, called a mask blank. The mask blank is preferably one hundred percent transmissive of the light intensity at the wavelength. At least one layer of an attenuated material that is at least partially transmissive to the wavelength of the light is formed on the optically transmissive substrate. The at least one layer of the attenuated material preferably blocks from about fifty percent to about ninety-four percent of the intensity of the light at the wavelength, whereas the prior art masks use materials that block about six percent of the intensity of the light at the wavelength. The attenuated material defines three feature types on the mask, including a primary image having edges, a scattering bar disposed near the edges of the primary image, and a background region. The primary image represents the desired image to be printed on the substrate. The scattering bar is adapted to enhance a contrast of the primary image and to at least reduce the intensity of the light at the edges of the primary image. The background region is adapted to block the light without using a material that is non transmissive to the light, such as chrome. By "block the light" it is meant that the background region substantially and preferably reduces the intensity of the light passing through the background region to about zero.

20 Claims, 7 Drawing Sheets

CHROMELESS PHASE SHIFT MASK

FIELD

This invention relates to the field of integrated circuit fabrication. More particularly, this invention relates to the design of the masks that are used during photolithographic processing of integrated circuits.

BACKGROUND

As integrated circuit technologies continually push toward placing more devices into smaller spaces, new photolithography methods and systems are required to resolve the increasingly smaller features. These new methods are generally called resolution enhancement techniques, and include methods such as attenuated phase shift masks and alternating phase shift masks. Attenuated phase shift masks and alternating phase shift masks were developed during the 1980's but failed to provide the manufacturable solutions to implement them successfully. The standard 6% attenuated phase shift mask technique failed to extend current lithography techniques without a reduction in wavelength, and the alternating phase shift mask technique was plagued with design, mask manufacturing, and lens aberration issues.

It was later discovered that, by increasing the background transmission of a mask, the attenuated phase shift mask technique could provide improved resolution and reduce the mask error enhancement factor, but this also introduced a new manufacturing issue. The higher transmission background required embedded chrome patches to prevent contrast from leaking into unwanted areas. The embedded patches of chrome added additional complexity and cost to implement this technique. This resolution enhancement technique is generally called embedded attenuated phase shift masks.

The chrome in an embedded attenuated phase shift mask requires additional mask and etch process steps to manufacture, and any errors in either the layout placement or the manufacture placement results in contrast leakage. As the feature pitches on the mask vary from dense to isolated feature types, an intelligent or contrast detecting algorithm is required for chrome placement. Also, the complexity of chrome repair increases for damaged chrome features that are in proximity to other chrome features. The chrome has to be placed close enough to the primary features such as contacts, vias, and trenches, to block any unwanted contrast with any high transmission scenario.

There is a need, therefore, for a mask that doesn't require chrome or another opaque material to completely block transmission, and which can still be used with high transmission backgrounds.

SUMMARY

The above and other needs are met by a photolithographic mask for receiving light at a wavelength, phase, and intensity and printing a desired image on a substrate with an optical system. The mask is formed on an optically transmissive substrate, called a mask blank. The mask blank is preferably about one hundred percent transmissive of the light intensity at the wavelength. At least one layer of an attenuated material that is at least partially transmissive to the wavelength of the light is formed on the optically transmissive substrate. The at least one layer of the attenuated material preferably blocks from about fifty percent to about ninety-four percent of the intensity of the light at the wavelength, whereas the prior art masks use materials that block about six percent of the intensity of the light at the wavelength. Chrome, by contrast, blocks one hundred percent of the light at the wavelength.

The attenuated material defines three feature types on the mask, including a primary image having edges, a scattering bar preferably disposed near the edges of the primary image, and a background region. The primary image represents the desired image to be printed on the substrate. The scattering bar is adapted to enhance a contrast of the primary image and to at least reduce the intensity of the light at the edges of the primary image. The background region is adapted to block the light without using a material that is non transmissive to the light, such as chrome. By "block the light" it is meant that the background region substantially and preferably reduces the intensity of the light passing through the background region to about zero, or at least to a point where it does not substantially expose the photoresist on the wafer.

In this manner, opaque chrome patches, or patches of another non transmissive material, are not required to block the light, regardless of the background attenuation. Thus, only the attenuated material need be used to both resolve small images and provide dark field areas, instead of adding additional opaque layers such as chrome. This both reduces the cost and complexity of the mask.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 2:
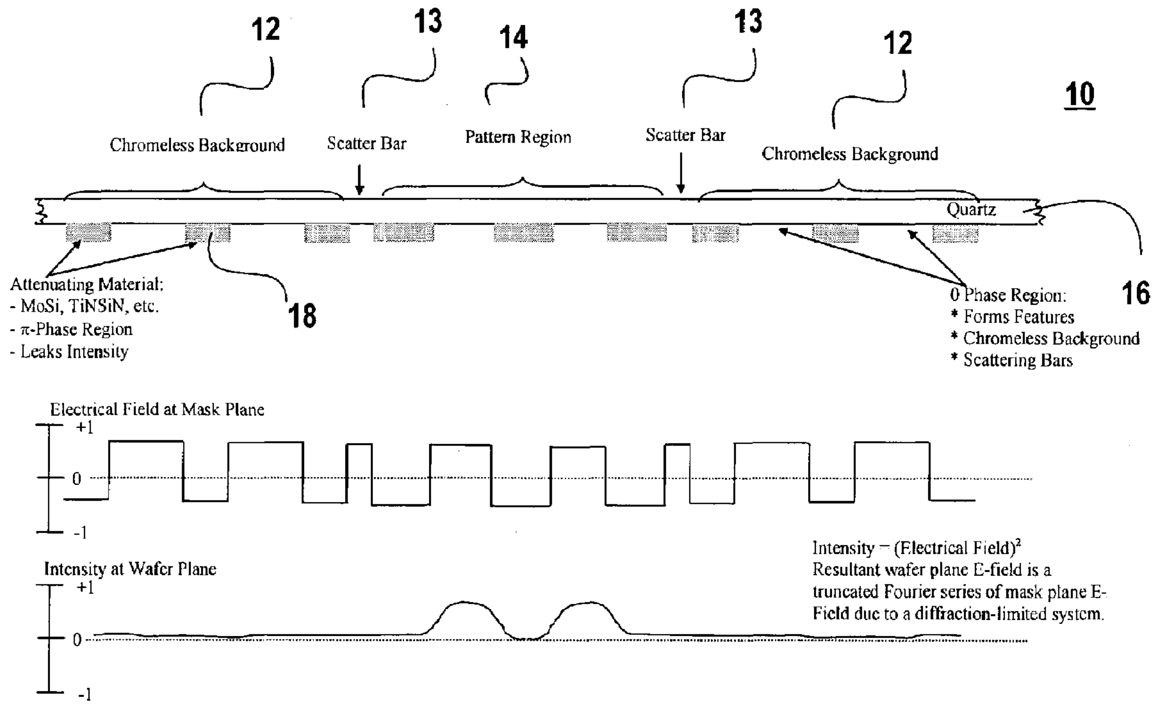
FIG. 2 is a cross sectional view of mask according to the present invention, additionally depicting electrical field at the mask plane and intensity at the wafer plane.

With reference now to FIG. 2, there is depicted a cross sectional view of a mask 10 according to the present invention. The mask 10 is preferably formed of a substrate 16 that is substantially transparent to the wavelength of light that is used with the mask 10. Most preferably the substrate 16 of the mask 10 is formed of quartz, but may alternately be formed of other materials such as sapphire. The mask 10 includes three portions, the first portion being a pattern or primary portion 14, the second portion being the scattering bars 13, and the third portion being a background portion 12. The pattern region 14 is designed for forming patterns in the integrated circuit substrate to be patterned, while the background portion 12 is designed to block light from impinging on the integrated circuit substrate and exposing the photoresist. The scattering bars 13 enhance the primary features 14 and reduce the background intensity of the light.

It is appreciated that in many places in this description, reference is made to the background portion 12 blocking the light from reaching the integrated circuit. However, this complete blockage of light is only one specific embodiment, and in alternate embodiments the intensity of the light that passes through the background portion 12 of the mask 10 is not completely blocked, but the effective intensity of the light passing through the background portion 12 is so reduced that it is insufficient to expose the photoresist that is on the integrated circuit substrate. Thus, all such references to completely blocking the light are understood to also include those cases where the intensity of the transmitted light is reduced to the point that it does not expose the photoresist.

The first feature type 14, being the primary pattern feature type, is intended to resolve at the wafer plane, or in other words on the substrate that receives the image, and is defined by removal of the attenuating transmissive material, thereby allowing 100% transmission. The second feature type 13, known as but not limited to sub-resolution features such as scattering bars, is also defined by the removal of the attenuating transmissive material but is not intended to resolve at the wafer plane. The second feature type 13 is intended to increase the contrast of the first feature type while reducing the background intensity. The third feature type 12, or in other words the background region, is again defined by removal of the attenuating transmissive material and is again not intended to resolve at the wafer plane. The third feature type 12 is a diffraction grating, at least reducing and preferably eliminating any background intensity, and is preferably optically optimized for a given wavelength, illumination source, and transmission intensity. The second feature type 13 is preferably placed between the first 14 and third 12 feature types for optimal primary pattern 14 fidelity. Formation of the first, second, and third feature types 12, 13, and 14 can be accomplished with a single exposure step during the mask fabrication process.

Figure 7A:
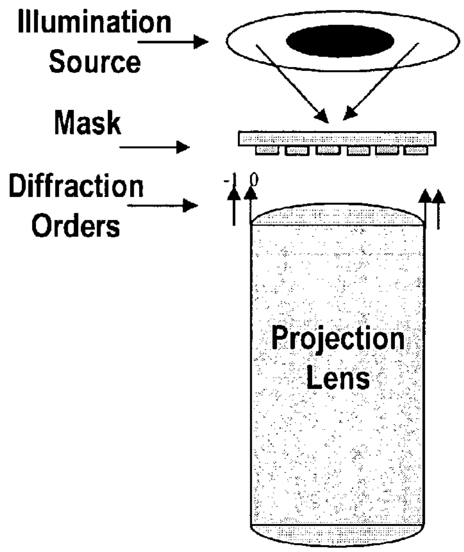
FIG. 7A depicts diffraction orders with an off axis illumination source and a third feature type formed with a grating with a pitch smaller than the resolution limit of the optical system.
Figure 7B:
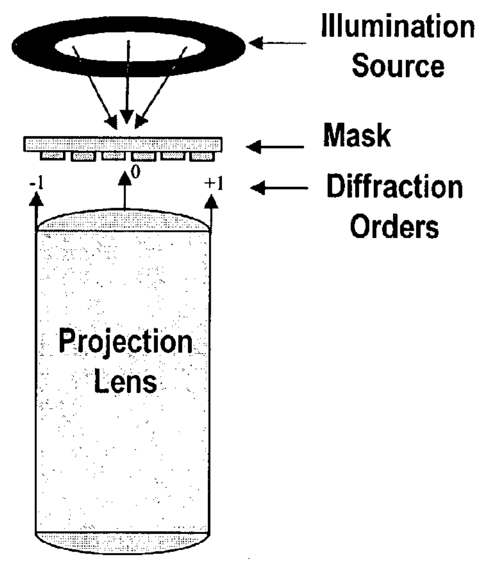
FIG. 7B depicts diffraction orders with a convention illumination source and a third feature type formed with a grating with a pitch smaller than the resolution limit of the optical system.

The diffraction grating generated as part of the third feature type 14 can reduce and preferably cancel the background intensity by two approaches. The first approach is to generate a grating with a pitch smaller than the resolution limit of the optical system along with off-axis illumination, annular, quadrapole, or QUASAR, for example. As FIG. 7A details, with off-axis illumination the zero and first order diffraction from the grating falls outside of the projection lens resulting in zero intensity. This technique fails to work with FIG. 7B, conventional or top-hat illumination, since the zero order diffraction intensity always resides in the center of the optical axis regardless of the pitch.

Figure 7C:
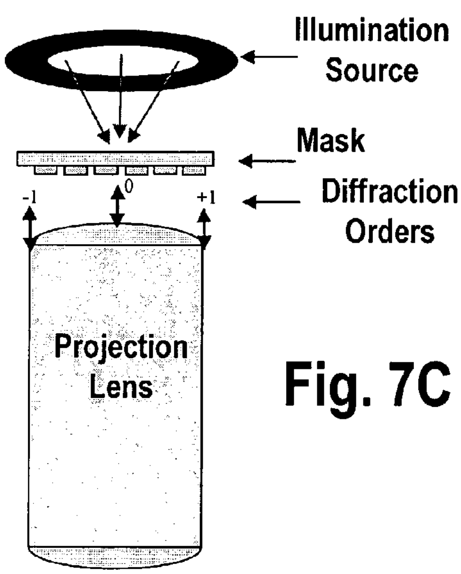
FIG. 7C depicts diffraction orders with a convention illumination source and a third feature type formed with a grating pitch and shape to match the 0° and 180° diffraction orders with respect to the magnitude and locations at the entrance pupil of the projection lens.

The second diffraction grating approach to create a background 12 can be used with any illumination technique but requires a grating pitch and shape to match the 0° and 180° diffraction orders with respect to the magnitude and locations at the entrance pupil of the projection lens. With this approach the first orders can be canceled along with the zero order as depicted in FIG. 7C.

The background portion 12, scattering bars 13, and pattern portion 14 are all preferably formed of regions 18 of a transmissive material that attenuate the light as it passes through the transmissive material. Most preferably the transmissive material is formed at a thickness such that it alters the phase of the light by about one hundred and eighty degrees as the light passes through the transmissive material, relative to the light that does not pass through the transmissive material. Thus, interference patterns are set up between the light that passes through the regions 18 and the light that passes only through the substrate 16. These interference patterns tend to cancel a portion of the light, or in other words reduce the intensity of the light as explained above, as it passes through the mask 10.

In the background portions 12 of the mask 10, the regions 18 are positioned so as to cancel or reduce the intensity of all of the light that passes through the background portions 12 of the mask 10, while in the pattern portions 14 of the mask 10, the regions 18 are positioned so as to form desired patterns in the light that passes through the pattern portions 14 of the mask 10 and reaches the integrated circuit substrate. FIG. 2 depicts these conditions by showing the electrical field intensities at the plane of the mask 10. Light that passes only through the mask substrate 16 preferably does not have an inverted electrical field, or phase, while light that passes through the transmissive attenuating regions 18 preferably does have an inverted electrical field, or phase.

By adjusting the spacing of the regions 18, the phase inversions of the light passing through the background portions 12 of the mask 10 have nearly a zero intensity at the wafer plane, as depicted, while the phase inversions of the light passing through the pattern portions 14 of the mask 10 produce very small areas where the intensity of the light at the wafer plane is high enough to expose the photoresist on the integrated circuit substrate. Thus, the phase inversions in the background portions 12 are used to cancel exposure of the photoresist, while the phase inversions in the pattern portions 14 are used to enhance the resolution of features that is possible with the wavelength of light being used. Sub resolution features of the second type 13 may be placed near the pattern regions 14 to enhance primary image contrast, while reducing the background intensity.

Thus, the mask 10 as depicted in FIG. 2 is preferably formed of only two layers, one being the substrate layer 16 and the other being the attenuating transmissive material 18, which is most preferably at least one of molybdenum silicide and a titanium nitride silicon nitride composite, or some other such material that produces the effects as described herein. Thus, additional layers of material such as chrome or some other opaque material are not required to effectually extinguish the light in the background portions 12.

The dark field high transmission chromeless background technique described herein provides increased resolution without chrome patches, or patches of other optically opaque material. The technique eliminates the need for the chrome regions by using instead phase intensity cancellation or diffraction dispersion in the dark field regions. This technique is a low cost alternative for dark field high transmission attenuated phase shift masks since only a single mask pattern and mask etch process is all that is required to form all three feature types 12, 13, and 14. As used herein, the term "dark field" is defined as any process layer that passes minimal source intensity during exposure. Historically, hole layers, such as contacts and vias, and trench layers, such as damascene metal structures, were defined as dark field.

Figure 1:
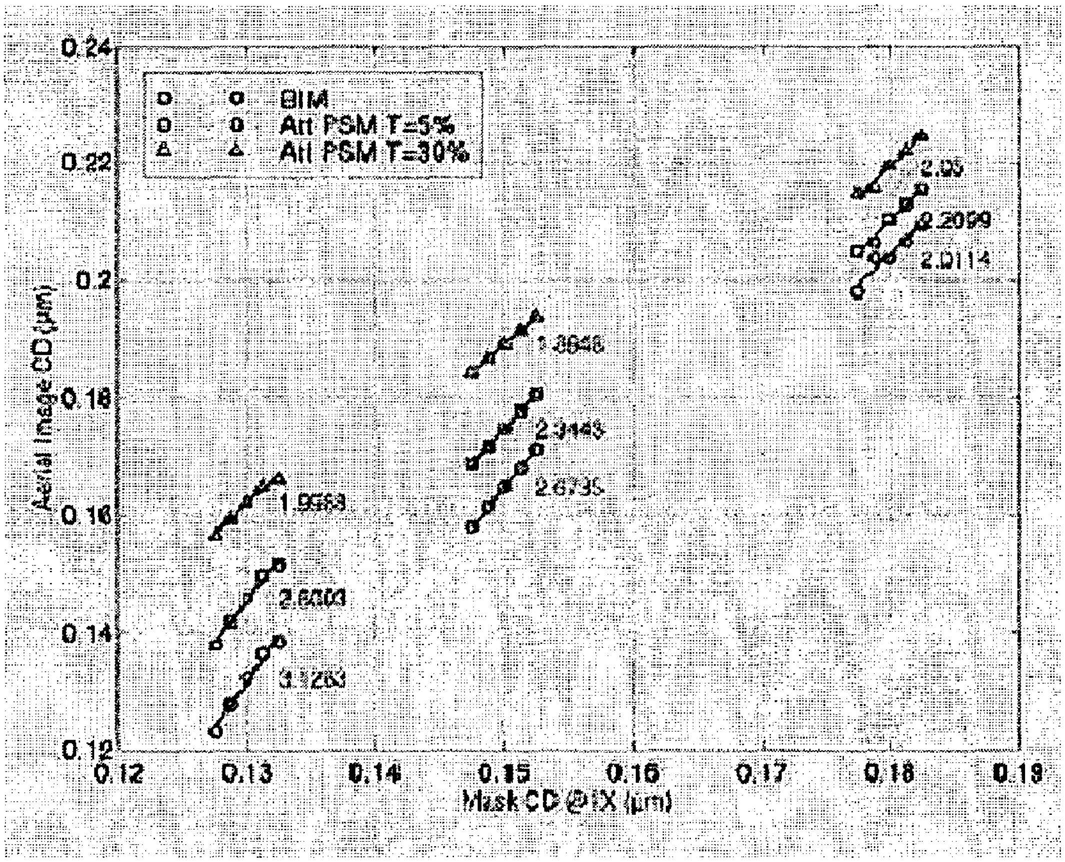
FIG. 1 is a chart depicting mask error enhancement with respect to background transmission.

The mask utilizes phase intensity cancellation or diffraction dispersion outside of the projection system to darken the background instead of chrome in a dark field application as shown in FIG. 1, which depicts a mask error enhancement factor that is reduced (i.e. minimal wafer critical dimension range due to reticle critical dimension variation) as the transmission is increased. FIG. 1 is a chart of simulations of mask error enhancement factors for attenuating phase shift masks for an isolated line at 0.13, 0.15 and 0.18 micrometers with a numerical aperture of 0.63 and a sigma of 0.75. As depicted in FIG. 1, as the transmittance increases, the mask error enhancement factor increases at a lesser rate for the smaller critical dimensions.

For example, the wafer critical dimensions will vary about 31 nanometers for about ten nanometers of variation on a 130 nanometer binary mask, the wafer critical dimensions will vary about twenty-eight nanometers for about ten nanometers of variation on a 130 nanometer 5% attenuated mask, and the wafer critical dimensions will vary about twenty nanometers for about ten nanometers of variation on a 130 nanometer 30% attenuated mask. Although the smaller mask error factor is desired for dark field applications, using a high transmission mask is not desirable without an intensity cancellation technique, such as is disclosure herein.

In this manner the mask may be formed with only a single attenuated layer of a transmissive material such as molybdenum silicide (MoSi) or titanium nitride silicon nitride (TiNSiN), without using chrome as a transmission blocking layer, as depicted in FIG. 2. This single attenuated layer high transmission phase shift mask is very simple to create with a single exposure and etch process, thus reducing cost and eliminating the additional chrome print and etch steps. Additionally, the technique will work with all attenuations and monochromatic wavelengths.

Figure 3A:
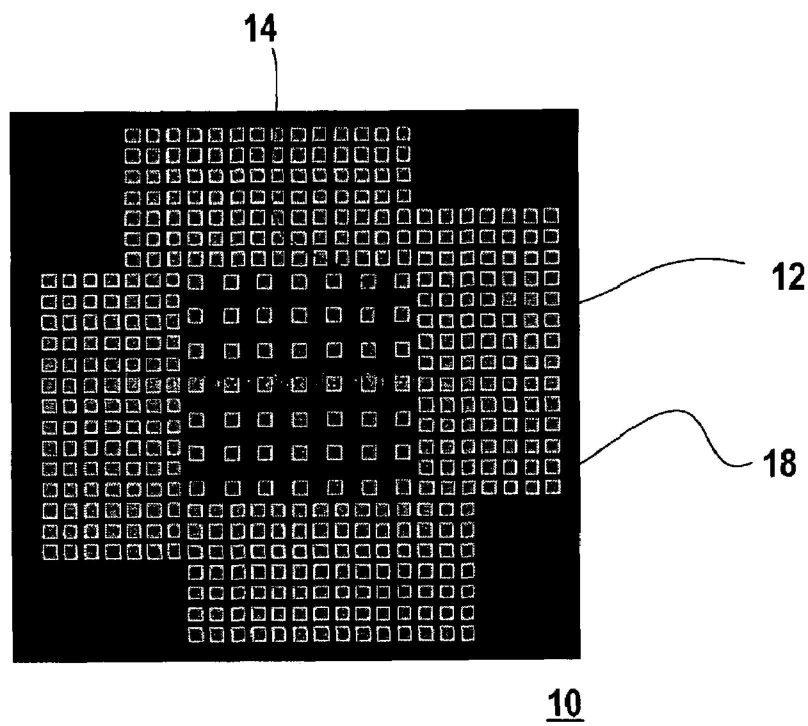
FIG. 3A is a top plan view of a mask according to the present invention, depicting a first feature type or primary image, and the third feature type or background darkening pattern.
Figure 3B:
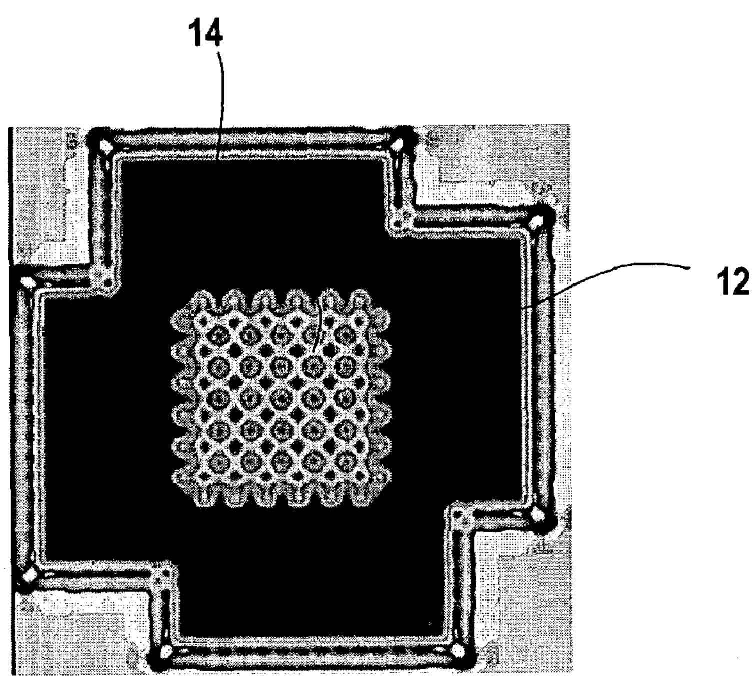
FIG. 3B is a chart depicting the intensity of light at the wafer plane as produced by the mask of FIG. 3A.

The phase cancellation background features are optimal when the intensity of the phase shifting regions is of equal intensity to the non phase shifting regions, which produces a zero transmission result. Likewise, diffracting the orders of light outside the projection lens using off-axis illumination produces a zero transmission result. The results of these techniques are depicted in FIGS. 3A and 3B. FIG. 3A depicts a mask 10, where the background portion 12 is formed by etching blocks into the attenuating transmissive material, where the blocks are both sized and spaced so as to effectively extinguish the light passing through the background portion 12 of the mask 10. FIG. 3B is a simulation of the intensity of light passed by the mask 10 of FIG. 3A. It is apparent by the dark regions that the light is effectively extinguished in the background portion 12.

Preferably, the regions 18 between the blocks are about one hundred and eighty degrees out of phase with the actinic wavelength (W), and the pitch of the blocks is below the resolution limit of the optical lithographic system. The resolution limit can be defined from Raleigh's criterion as k1(W/NA), where the k1 is a constant (classically k1 was 0.61) and NA is the numerical aperture of the projection lens of the optical lithographic system (NA can be defined as sinθ of the optical axis from mask plane to the edge of the entrance pupil of the projection lens), and W is the wavelength of the light.

Figure 4:
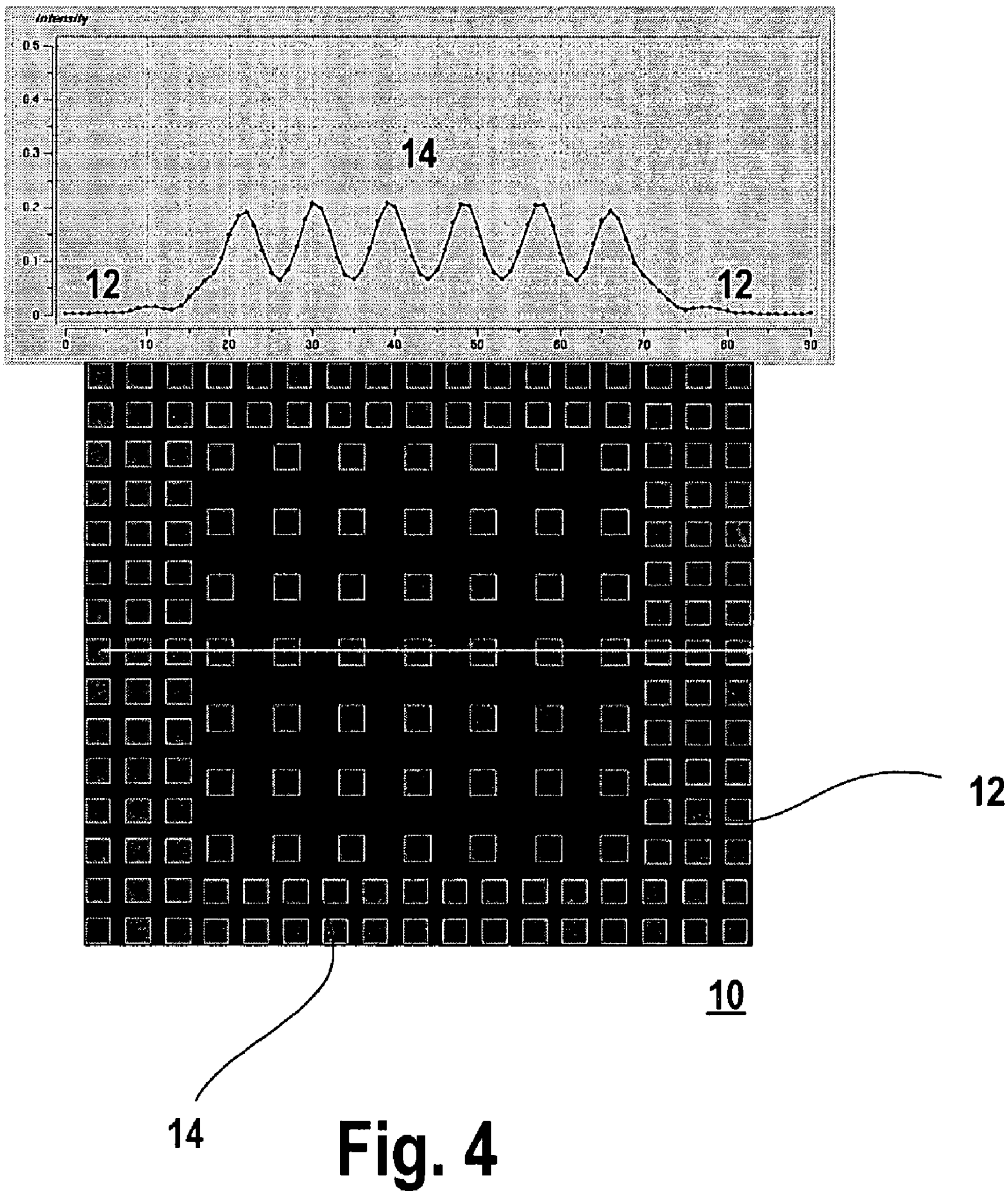
FIG. 4 is a plot of light intensity for the third feature type or background regions of the high transmission attenuated phase shift mask of FIG. 3A.

As long as the pitch is below the resolution limit of the optical lithographic system, the background features can be of any size desired by the mask manufacturer, making the features relatively easy to form. The shapes and sizes of the background features can vary, but are best arrayed referenced to minimize data size, since millions of features are generated in this process. The only requirement is that the background structures are arrayed at a pitch optimal for reduced or zero transmission as shown in FIG. 4, which depicts in graph mode close to zero intensity of the light from the background portions 12 of a high transmission mask.

Figure 5:
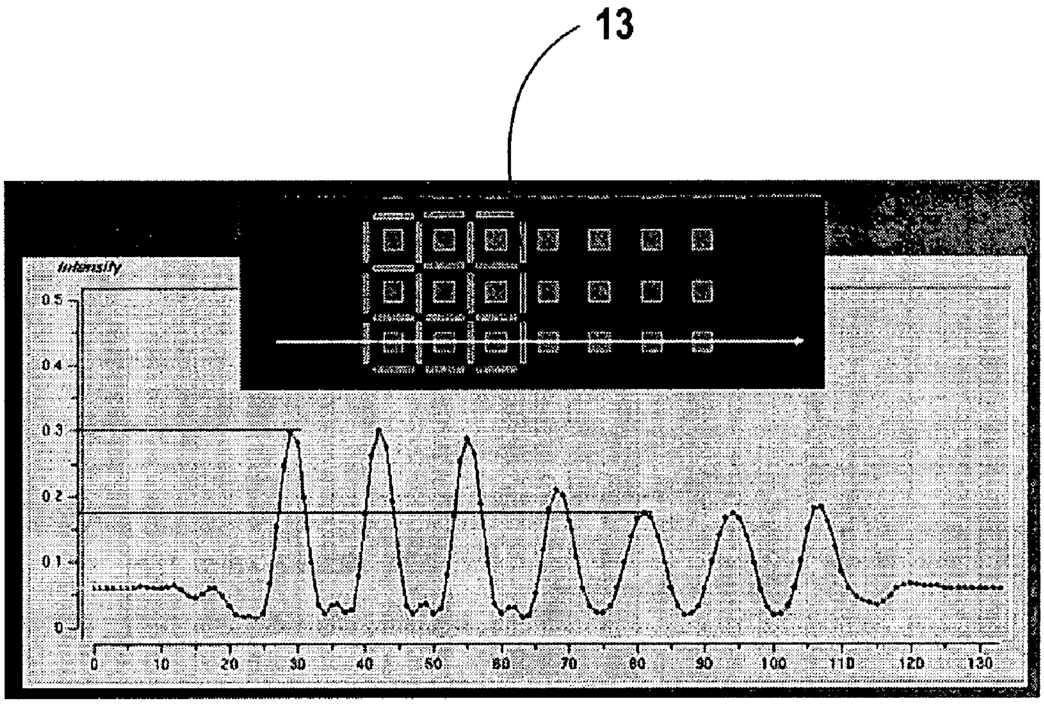
FIG. 5 is a plot of light intensity for the first feature types of a 6% attenuated phase shift mask, with the second feature types or scatter bars included on the mask.
Figure 6:
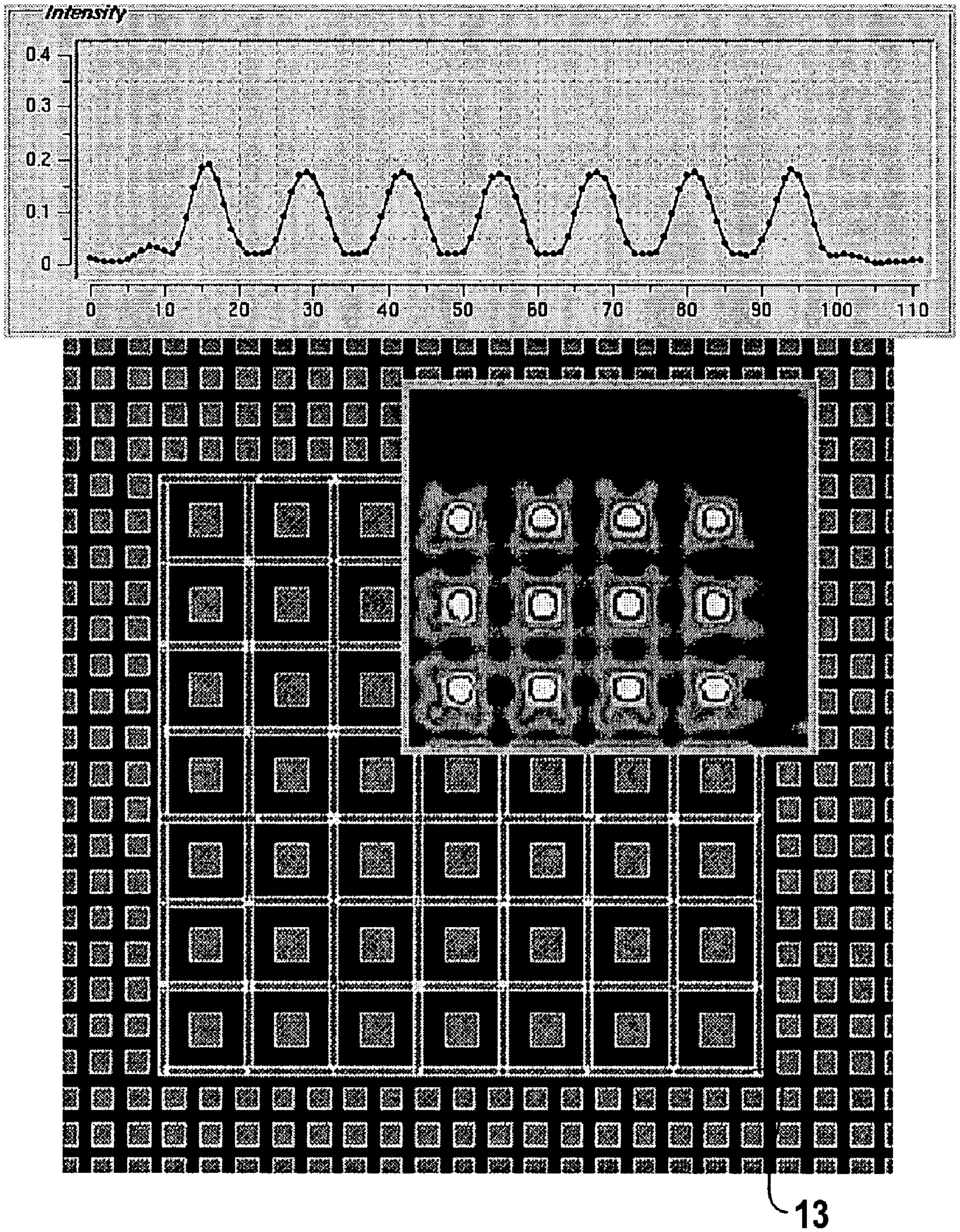
FIG. 6 is a plot of light intensity for the first, second, and third feature types of the mask of FIG. 3A, showing additional resolution enhancement and background darkening with the scatter bars and background features.

Scattering bars 13 as shown in FIG. 5 are preferably placed first with a contrast-enabling engine, such as the contrast-based scattering bars developed by Mentor Graphics Corp. of Wilsonville Oreg. The regions 18 in the background portion 12 are preferably arrayed referenced starting from an optimal distance from the scattering bars 13 and merged in the field regions as shown in FIG. 6. The mask 10 is most preferably written on a laser tool or with a stenciled electron beam tool to minimize mask manufacturing run times.

Thus, the chromeless mask 10 of the present invention provides several benefits, including a reduction in mask plane heating due to the lack of absorber material, a low cost high resolution enhancement technique, simple mask processing technique, low mask error enhancement factors when used with high transmission lithography, removal of the defect susceptible chrome from the mask, and low or zero intensity background for low and high transmission attenuated phase shift mask applications.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A photolithographic mask for receiving light at a wavelength, phase, and intensity and printing a desired image on a substrate with an optical system, the mask comprising:

an optically transmissive substrate, and at least one layer of an attenuated material that is at least partially transmissive to the wavelength of the light, the attenuated material defining three feature types on the mask, including a primary image having edges, the primary image representing the desired image to be printed on the substrate, a scattering bar disposed near the edges of but not touching the primary image, the scattering bar adapted to enhance a contrast of the primary image and to at least reduce the intensity of the light at the edges of the primary image, and a background region adapted to block the light without using a material that is substantially non transmissive to the light.

2. The photolithographic mask of claim 1, wherein the mask is a dark field mask.

3. The photolithographic mask of claim 1, wherein the attenuated transmissive material is molybdenum silicide.

4. The photolithographic mask of claim 1, wherein the attenuated transmissive material is titanium nitride silicon nitride.

5. The photolithographic mask of claim 1, wherein the feature types comprise patterns of openings in the attenuated transmissive material, where the attenuated transmissive material changes the phase of the light by about one hundred and eighty degrees and the openings in the attenuated transmissive material do not change the phase of the light.

6. The photolithographic mask of claim 1, wherein the feature types comprise patterns of openings in the attenuated transmissive material, where the attenuated transmissive material changes the phase of the light by about one hundred and eighty degrees relative to the openings in the attenuated transmissive material.

7. The photolithographic mask of claim 1, wherein the feature types comprise patterns of openings in the attenuated transmissive material, where the pitch of the openings in the attenuated transmissive material of the background region feature type is below a resolution limit of the optical system.

8. The photolithographic mask of claim 1, wherein the feature types comprise patterns of openings in the attenuated transmissive material, where the pitch of the openings in the attenuated transmissive material of the background region feature type is below a resolution limit of the optical system, where the resolution limit is determined by k1 times the wavelength of the light divided by a numerical aperture of a projection lens of the optical system.

9. The photolithographic mask of claim 1, wherein the feature types comprise patterns of openings in the attenuated transmissive material, where the pitch of the openings in the attenuated transmissive material of the background region feature type is below a resolution limit of the optical system, where the resolution limit is determined by 0.61 times the wavelength of the light divided by a numerical aperture of a projection lens of the optical system.

10. A photolithographic mask for receiving light at a wavelength, phase, and intensity and printing a desired image on a substrate with an optical system, the mask comprising:

an optically transmissive substrate, and at least one layer of an attenuated material that is at least partially transmissive to the wavelength of the light, where the attenuated material is at least one of titanium nitride silicon nitride and molybdenum suicide, the attenuated material defining three feature types on the mask, including a primary image having edges, the primary image representing the desired image to be printed on the substrate, a scattering bar disposed near the edges of but not touching the primary image, the scattering bar adapted to enhance a contrast of the primary image and to at least reduce the intensity of the light at the edges of the primary image, and a background region adapted to block the light without using a material that is substantially non transmissive to the light.

11. The photolithographic mask of claim 10, wherein the mask is a dark field mask.

12. The photolithographic mask of claim 10, wherein the feature types comprise patterns of openings in the attenuated transmissive material, where the attenuated transmissive material changes the phase of the light by about one hundred and eighty degrees and the openings in the attenuated transmissive material do not change the phase of the light.

13. The photolithographic mask of claim 10, wherein the feature types comprise patterns of openings in the attenuated transmissive material, where the attenuated transmissive material changes the phase of the light by about one hundred and eighty degrees relative to the openings in the attenuated transmissive material.

14. The photolithographic mask of claim 10, wherein the feature types comprise patterns of openings in the attenuated transmissive material, where the pitch of the openings in the attenuated transmissive material of the background region feature type is below a resolution limit of the optical system.

15. The photolithographic mask of claim 10, wherein the feature types comprise patterns of openings in the attenuated transmissive material, where the pitch of the openings in the attenuated transmissive material of the background region feature type is below a resolution limit of the optical system, where the resolution limit is determined by k1 times the wavelength of the light divided by a numerical aperture of a projection lens of the optical system.

16. The photolithographic mask of claim 10, wherein the feature types comprise patterns of openings in the attenuated transmissive material, where the pitch of the openings in the attenuated transmissive material of the background region feature type is below a resolution limit of the optical system, where the resolution limit is determined by 0.61 times the wavelength of the light divided by a numerical aperture of a projection lens of the optical system.

17. A method of forming a photolithographic mask for receiving light at a wavelength, phase, and intensity and printing a desired image on a substrate with an optical system having a resolution limit the method comprising forming on an optically transmissive substrate a background region adapted to block the light without using a material that is substantially non transmissive to the light, where the background region is formed of at least one layer of an attenuated material that is at least partially transmissive to the wavelength of the Light, and the at least one layer of the attenuated material changes the phase of the light by about one hundred and eighty degrees relative to the optically transmissive substrate.

18. The method of claim 17, further comprising forming on the optically transmissive substrate a primary image having edges, the primary image representing the desired image to be printed on the substrate, where the primary image is formed of at least one layer of the attenuated material.

19. The method of claim 18, further comprising forming a scattering bar disposed near the edges of the primary image, the scattering bar adapted to enhance a contrast of the primary image and to at least reduce the intensity of the light at the edges of the primary image, where the scattering bar is formed of at least one layer of the attenuated material.

20. The method of claim 17, wherein the attenuated transmissive material is at least one of molybdenum suicide and titanium nitride silicon nitride.

* * * * *